(12) United States Patent
Samson et al.

(10) Patent No.: US 7,985,469 B2
(45) Date of Patent: Jul. 26, 2011

(54) PARTICLE NETWORK COMPRISING PARTICLES DISPOSED ON A SUBSTRATE AND METHOD FOR REALIZING SUCH A NETWORK

(75) Inventors: Yves Samson, Saint Martin d'Heres (FR); Franck Fournel, Villard-Bonnot (FR); Joel Eymery, Sassenage (FR)

(73) Assignee: Commissariat a l'Energie Atomique, Paris (FR)

( * ) Notice: Subject to any disclaimer, the term of this patent is extended or adjusted under 35 U.S.C. 154(b) by 886 days.

(21) Appl. No.: 11/718,859

(22) PCT Filed: Nov. 3, 2005

(86) PCT No.: PCT/FR2005/002728
§ 371 (c)(1),
(2), (4) Date: Sep. 24, 2007

(87) PCT Pub. No.: WO2006/051186
PCT Pub. Date: May 18, 2006

(65) Prior Publication Data
US 2008/0160316 A1 Jul. 3, 2008

(30) Foreign Application Priority Data

Nov. 9, 2004 (FR) ..................... 04 11916

(51) Int. Cl.
*B32B 5/16* (2006.01)
*B32B 7/00* (2006.01)
*B05D 3/00* (2006.01)
*B05D 7/00* (2006.01)

(52) U.S. Cl. ........ 428/323; 428/206; 428/403; 427/197; 427/201; 427/299; 427/444
(58) Field of Classification Search .................. 428/332, 428/403; 427/197, 201, 299, 444, 532
See application file for complete search history.

(56) References Cited

U.S. PATENT DOCUMENTS 3,102,444 A 9/1963 Basile
5,609,907 A * 3/1997 Natan .......................... 427/2.12
(Continued)

FOREIGN PATENT DOCUMENTS
EP 0 977 182 A2 2/2000
(Continued)

OTHER PUBLICATIONS

J.P. Hoogenboom, et al., "Template-Induced Growth of Close-Packed and Non-Close-Packed Colloidal Crystals During Solvent Evaporation", American Chemical Society, Nano Letters 2004, vol. 4, No. 2, pp. 205-208.
(Continued)

*Primary Examiner* — Holly T Le
(74) *Attorney, Agent, or Firm* — Brinks Hofer Gilson & Lione

(57) ABSTRACT

The invention relates to a method for realizing a particle network comprising a particle depositing step, capable of self-organizing with a determined increment along a first direction, onto a substrate exhibiting a property that permits an interaction between the substrate and the particles and modulated along the first direction with a period adapted to said increment. A substantial interaction thus subsists between each of the particles and its neighboring particles along the first direction.

23 Claims, 3 Drawing Sheets

U.S. PATENT DOCUMENTS

| | | | |
|---|---|---|---|
| 6,242,264 B1 * | 6/2001 | Natan et al. | 436/171 |
| 7,041,394 B2 * | 5/2006 | Weller et al. | 428/836 |
| 7,045,195 B2 * | 5/2006 | Ozin et al. | 428/173 |
| 7,258,743 B2 * | 8/2007 | Fournel et al. | 117/101 |
| 2002/0015792 A1 * | 2/2002 | Nagayama et al. | 427/299 |
| 2002/0132083 A1 * | 9/2002 | Weller et al. | 428/65.3 |
| 2006/0172126 A1 * | 8/2006 | Long et al. | 428/209 |

FOREIGN PATENT DOCUMENTS

| | | |
|---|---|---|
| EP | 1 081 513 A1 | 3/2001 |
| WO | WO 99/05711 A1 | 2/1999 |
| WO | WO 01/00522 A2 | 1/2001 |
| WO | WO 01/42540 A1 | 6/2001 |
| WO | WO 02/29876 A1 | 4/2002 |
| WO | WO 02/33461 A2 | 4/2002 |
| WO | WO 02/054466 A1 | 7/2002 |

OTHER PUBLICATIONS

"Monodisperse FePt Nanoparticles and Ferromagnetic FePt Nanocrystal Superlattices" by S. Sun et al. in Science, Mar. 17, 2000 (vol. 287, pp. 1989-1992).

"Templated Self-Assembly of Block Copolymers: Effect of Substrate Topography" by J.Y. Chen et al. in Adv. Mater. 2003 15, No. 19, Oct. 2, Wiley-VCH Verlag.

"Ultra thin silicon films directly bonded onto silicon wafers", by F. Fournel et al., in Materials Science and Engineering B73 (2000) 42-46, Elsevier Science S.A.

"Controlled surface nanopatterning with buried dislocation arrays", by F. Leroy et al. in Surface Science 545 (2003) 221-219, Elsevier B.V.

* cited by examiner

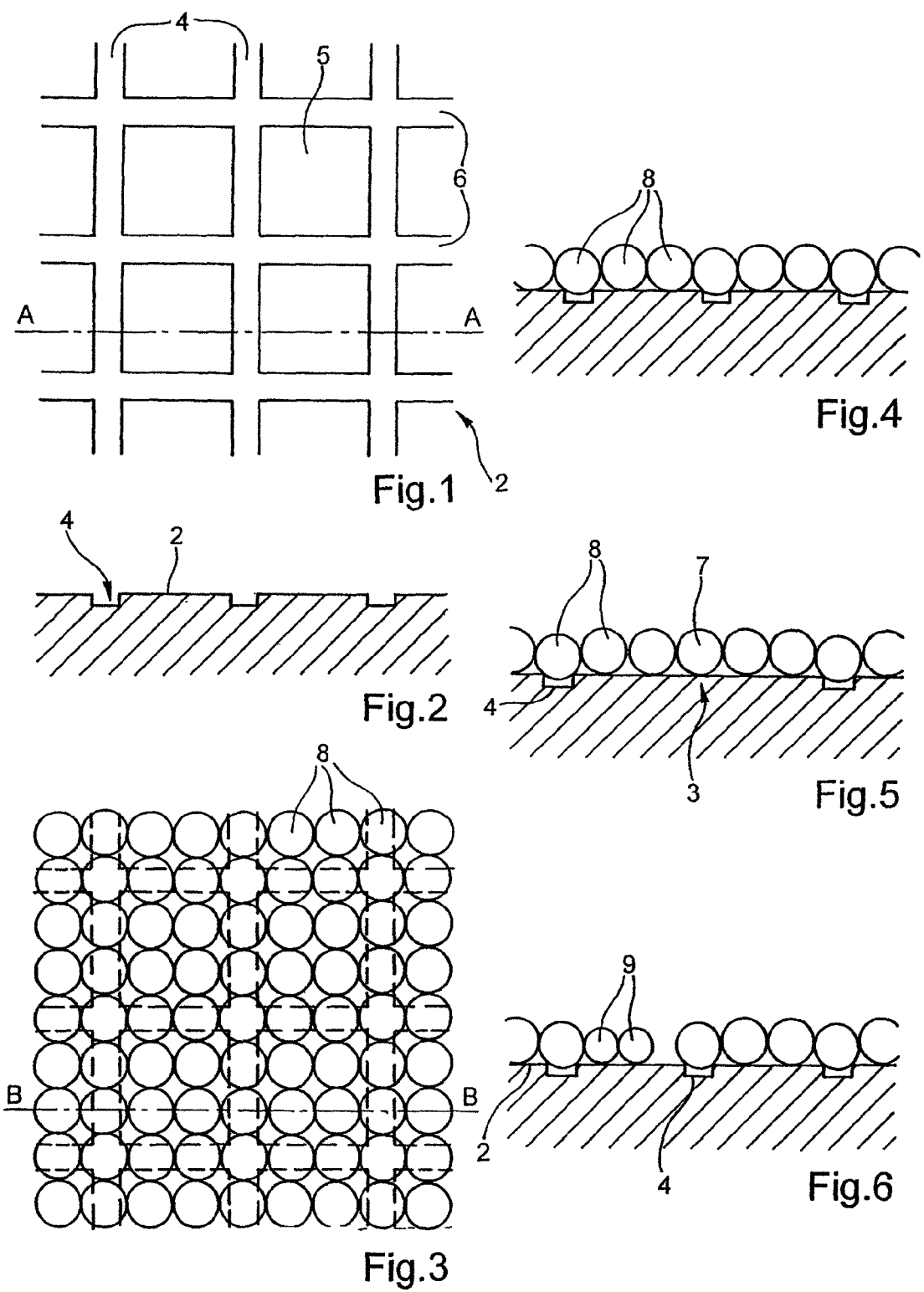

PARTICLE NETWORK COMPRISING PARTICLES DISPOSED ON A SUBSTRATE AND METHOD FOR REALIZING SUCH A NETWORK

PRIORITY CLAIM

This application is U.S. nationalization of PCT Application No. PCT/FR2005/002728, filed Nov. 3, 2005, and claims priority to French patent application No. 0411916, filed Nov. 9, 2004.

TECHNICAL FIELD

The invention concerns an array of particles, for example of nanoparticles, and a method for realizing such an array.

BACKGROUND

The study of matter with smaller and smaller dimensions in various fields of science is now leading to orders of magnitude at which it can no longer be considered as a continuous structure, but rather as a discrete set of particles, generally called nanoparticles.

In this context, the organization of the particles in a periodic array is a requirement in numerous applications, such as ultra-high-density magnetic information media (ferromagnetic nanoparticles), memories based on semiconductor nanoparticles, arrays of luminescent nanoparticles or the formation of catalytic of reactional sites with very small dimensions, for example.

In these applications, and naturally in others, the organization of the particles in an array that is as perfect as possible is desirable, but very difficult to achieve in practice, in particular over sufficiently great distances.

In an attempt to respond to this requirement, it has for example been proposed to form arrays thanks to the self-organization of the particles, i.e. thanks to the interactions that occur between the particles, for example as described in the paper "Monodisperse FePt Nanoparticles and Ferromagnetic FePt Nanocrystal Superlattices" by S. Sun et al. in Science, 17 Mar. 2000 (volume 287, pages 1989-1992).

However, it is generally not possible to avoid the presence of defects (for example gaps in the array—point defects—or offsets in translation or in orientation between regions of the array—extended defects), which in practice makes it impossible to form arrays over great distances by the simple self-organization of the particles.

In an attempt to control the organization of the particles over greater distances, it has been proposed to dispose assemblies of particles constituting a part of an array in lithographed structures formed on the surface of a substrate. The paper "Templated Self-Assembly of Block Copolymers: Effect of Substrate Topography" by J. Y. Chen et al. in Adv. Mater. 2003 15, No. 19, October 2, Wiley-VCH Verlag relates to solutions of this type.

Choosing dimensions of the lithographed structures less than the distance conventionally separating two defects of the array of particles produces in each lithographed structure an assembly of particles in the form of an array that has no defects if the average distance between defects, which is a statistical datum, is respected in that assembly.

Although this technique reduces the number of defects, it cannot prevent their occurrence in certain cases. Moreover, the extent as such of the array is limited to the dimensions of the lithographed structure, the presence of which also prevents the use of the entirety of the available area.

It has also been proposed to use a substrate whose lithographed patterns interact strongly with the particles, to the point where this substrate-particle interaction predominates in controlling the location of the particles. In this solution, it is therefore the defects of the substrate, which it is naturally impossible to make perfect, that cause the defects of organization of the array (which could incidentally already be the case in the solution referred to previously).

SUMMARY

The invention is therefore aimed in particular at a solution for organizing an array of particles that ensures optimum regularity of the array over great distances.

The invention therefore proposes an array of particles disposed on a substrate having a property enabling an interaction of the substrate and the particles, characterized in that said property is modulated periodically in a first direction enabling substantial interaction between each of the particles and its neighbor particles in the first direction.

The tendency to self-organization of the particles (thanks to their interaction) is thus combined with the organizational effect of the substrate, and not dominated by the latter, which ensures greater regularity in the organization of the array.

Thus, in the absence of modulation of said property, the interaction between each of the particles and its neighbor particles would have allowed local self-organization of the particles in this first direction.

To obtain these effects in a particular efficacious manner, the intensity of the particle—substrate interaction may be prevented from locally dominating the particle-particle interactions.

A second property enabling interaction of the substrate and the particles, possibly identical to said property, may further be modulated in a second direction enabling substantial interaction between each of the particles and its neighbor particles in the second direction.

The great regularity of the array previously mentioned is thus assured in both directions of the face of the substrate.

In this case the array may be square or hexagonal. Alternatively, it may be hexagonal.

If the particles are able to self-organize locally in the absence of modulation of the property with a particular increment in the first direction, said property may be modulated in the second direction with a period adapted to said increment, i.e. said period is essentially equal to said increment or to a multiple of said increment, for example.

Thus the array of particles may be organized in corresponding relationship to the modulation of the property offered by the substrate.

In one possible implementation, certain particles at least are formed by a central core covered by a shell. In this case, the shell participates in the substrate-particle interaction and/or the particle-particle interaction. The shell then facilitates forming the central cores into an array. The shell may be deformed to enable adaptation of the period of organization of the array.

Said property is for example linked to the topography of the substrate.

The interaction of the substrate and the particles may also be an interaction at a distance, for example of the magnetic or electrical type.

The array of particles need not be limited to two dimensions, but rather extend also in a direction essentially perpendicular to the surface of the substrate.

The invention also proposes a method of producing an array of particles, characterized in that it comprises a step of depositing particles able to self-organize with a particular increment in a first direction on a substrate having a property enabling interaction of the substrate and the particles and modulated in the first direction with a period adapted to said increment.

The particles may be formed before they are deposited on the substrate.

Thanks to this method, there is substantial interaction between each of the particles and its neighbor particles and the effect referred to above is therefore obtained.

If the particles can self-organize in an array with a second increment in a second direction, the substrate may further have a second property (possibly identical to said property) enabling interaction of the substrate and the particles modulated in the second direction with a period adapted to the second increment.

This produces an array of particles of great regularity in two directions, i.e. in two dimensions.

In one embodiment that may be envisaged, the method may comprise a step of formation of patterns on the substrate. This produces substrate-particle interactions linked to the topography of the substrate.

In practice, the step of formation of patterns may comprise a step of revealing an array of dislocations.

Alternatively, the step of formation of patterns may be effected by lithography or nanoimprinting.

The method may also comprise a step of deposition of material for producing said modulated property or determining the amplitude of the modulations of said modulated property.

The substrate-particle interactions are thus generated, or refined, by the material deposited.

The features of the array of particles mentioned above, and the resulting advantages, may also be applied to the method of producing the array that has just been mentioned.

BRIEF DESCRIPTION OF THE DRAWING

Other features and advantages of the invention will become apparent in the light of the following description, given with reference to the appended drawings, in which:

FIG. 1 represents a view from above of a substrate in a first embodiment of the invention;

FIG. 2 represents a section taken along the line A-A in FIG. 1;

FIG. 3 represents an array of particles disposed on the substrate from FIG. 1 in the first embodiment of the invention;

FIG. 4 represents a section taken along the line B-B in FIG. 3;

FIG. 5 represents the array of particles from FIG. 3 at the level of a defect in the substrate;

FIG. 6 represents the array of particles from FIG. 3 at the level of a defect in the array;

DETAILED DESCRIPTION

Figure 7:
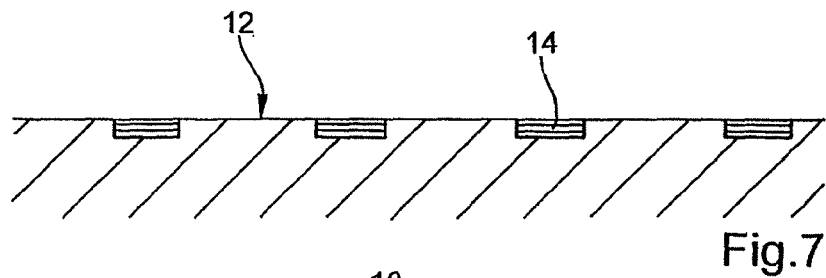
FIG. 7 represents a view in section of a substrate according to a second embodiment of the invention.

In a first embodiment described way of nonlimiting example with reference to FIGS. 1 to 4, the particles used are monodisperse FePt alloy nanoparticles each of which has a diameter of 6.3 nm and which form an array of contiguous particles as described in detail hereinafter.

Alternatively, there could be an array of non-contiguous particles.

FIG. 1 represents diagrammatically a substrate intended to receive the particles. The surface of the substrate 2 features an array of grooves (or furrows) formed by a first set of grooves 4 parallel to each other in a first direction and a second set of grooves 6 parallel to each other in a second direction and perpendicular to the grooves 4 of the first set.

In each of the first and second sets of grooves, the grooves 4, 6 are separated by a distance at least substantially equal to the increment of the array of particles in the direction concerned or an integral multiple thereof.

Moreover, in accordance with one implementation option adopted in the example described here, the distance between the grooves 4 of the first set is identical to the distance between the grooves 6 of the second set and the grooves 4, 6 therefore form a square array.

Alternatively, especially if the increment of the array of particles is not the same in the first and second directions, the grooves may form a rectangular array. According to another variant, a hexagonal array may be used.

In the example represented in FIGS. 1 to 4, the distance between two adjacent parallel grooves 4, 6 is fixed at 18.9 nm (by a technique described hereinafter), which thus corresponds to three times the increment of the contiguous array formed by the 6.3 nm diameter FePt particles.

Alternatively, other distances between adjacent parallel grooves could be used, for example a distance of 6.3 nm equal to the increment of the array of particles in the case studied here, or a distance of 31.5 nm corresponding to five times the increment of the array of the same particles.

A substrate 2 featuring grooves in the form of a square array of the above type may be obtained, for example, by bonding a silicon-on-insulator (SOI) substrate featuring a layer of silicon approximately 10 nm thick to a solid silicon substrate having a thickness of the order of 500 micrometers, with relative rotation of the crystal axes of the two (1,0,0) silicon surfaces to be assembled, followed for example by revealing the array of dislocations formed in this way at the interface of the substrates by means of chemical attack.

In the variant already mentioned, a hexagonal array can be obtained by bonding (1,1,1) silicon surfaces by the same method.

Such techniques are described for example in the papers "Ultra thin silicon films directly bonded onto silicon wafers", by F. Fournel et al., in Materials Science and Engineering B73 (2000) 42-46, Elsevier Science S.A., and "Controlled surface nanopatterning with buried dislocation arrays", by F. Leroy et al. in Surface Science 545 (2003) 221-219, Elsevier B.V.

According to this technique, the increment λ of the array of grooves (i.e. the distance between adjacent parallel grooves) is linked to the angular rotation (or disorientation) Ψ between the two substrates by the following equation, in which $a_{Si}$ is the increment of the array of the substrate and for silicon has the value 0.5431:

$$\lambda = \frac{a_{si}}{2\sqrt{2} \cdot \sin(\psi/2)}$$

Thus the disorientation angle Ψ may be chosen to obtain the required distance λ between adjacent parallel grooves, i.e. a distance equal to the increment of the array of particles or to an integer multiple thereof.

For example, to obtain a distance between two adjacent parallel grooves (or an increment of the array of grooves) of 18.9 nm as in the example represented in FIGS. 1 to 4, a disorientation of 1.164° is used between the SOI substrate and the solid silicon substrate.

In the variants indicated above, an angle of 3.493° is used to obtain an increment or period of the array of grooves of 6.3 nm and an angle of 0.698° is used to obtain a period of 31.5 nm.

Note that, the angular resolution in the devices used at present being of the order of five thousandths of a degree for the disorientation between substrates, the distance between adjacent parallel grooves obtained is valid to within 0.25 nm in the last case referred to and with an accuracy lower than 0.1 nm in the first two cases.

Once the two substrates have been assembled by molecular bonding with a relative rotation defined as a function of the increment of the array of the grooves to be obtained, the substrate is eliminated from the SOI by mechanical-chemical polishing, for example, using the silicon oxide layer as a stop layer. The silicon oxide layer is then eliminated, for example using a solution of hydrofluoric acid (HF). The thin (about 10 nm thick) layer of silicon is then thinned by means of a chemical attack sensitive to the strains induced by the dislocations, for example a modified version of the Yang (HF/Cr03/H2O) type attack or a modified version of the Dash (HF/HNO3/H2O) type attack as indicated in the second paper referred to hereinabove.

Stopping the chemical attack at the level of the bonding interface (or just past that interface), thanks to the known rate of attack of the solution used, reveals the array of dislocations created at the interface of the substrates, which enables the square array of grooves (or furrows) 4, 6 shown in FIG. 1 to be obtained, which array may equally be seen as an array of protuberances 5.

Figure 12:
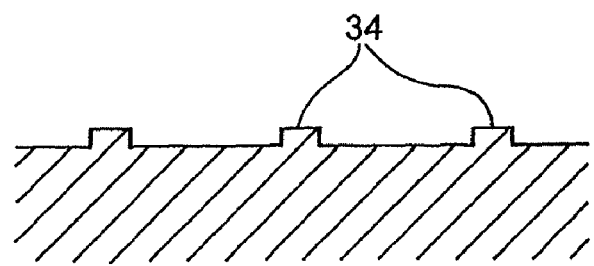
FIG. 12 represents a variant of the substrate from FIG. 3.

Alternatively, it may be required to use a structure complementary to that which has just been described, i.e. with protuberances 34 at the level of the grooves previously obtained, as represented in FIG. 12.

The following procedure may be used to obtain this type of structure.

According to a first solution, a metal (for example gold) is caused to diffuse at the level of the dislocations before the chemical revealing step. This forms a buried array of regions rich in metal. The array of protuberances 34 is then revealed by ionic abrasion, for example.

According to a second solution, an array of grooves is formed as described previously with reference to FIGS. 1 and 2, after which a material is deposited in these grooves (for example a metal such as gold on a silicon substrate) whose rate of abrasion by a beam of ions is lower than that of the substrate. The protuberances are then formed by ionic abrasion.

Figure 13:
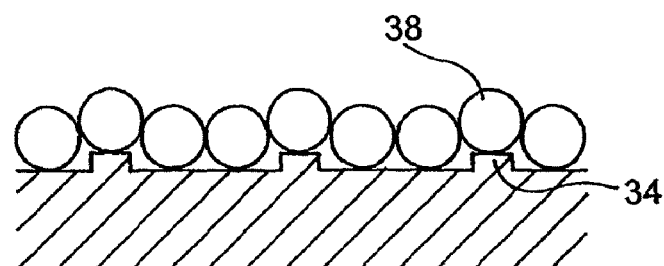
FIG. 13 represents an array of particles deposited on the substrate from FIG. 12.

Once the substrate has been prepared, the FePt nanoparticles 8 are deposited on the substrate, where they form a square array the structure of which is determined by the combination of the self-organization of the particles (caused by the interactions between particles, here on contiguous contact between them) and the location of at least a portion of the particles 8 on a preferred site of the substrate 2 (substrate-particle interaction) formed here by the grooves (or furrows) 4, 6 in the substrate 2 as shown in FIGS. 3 and 4 (or by the protuberances 34 in the variant envisaged in FIGS. 12 and 13 where the substrate-particle interaction considered generates a preferential location of a portion of the particles 38 on the protuberances 34).

Such a structure is obtained for example by dispersing the FePt nanoparticles 8 beforehand in a solution of hexane, depositing that solution on the substrate 2, and then slowly evaporating the hexane.

By construction, as indicated hereinabove, the increment of the square array of grooves 4, 6 present on the surface of the substrate 2 is substantially equal to the increment of the self-organized array of nanoparticles 8, or an integer multiple thereof, so that the combined action of the self-organization between particles 8 and the tendency to location of a portion of the particles 8 in the grooves 4, 6 leads to the organization of an array of particles with a structure substantially identical to the structure of the array that these particles would naturally have adopted locally on a substrate without modulation. The grooves 4, 6 in the substrate 2 (or where applicable the protuberances 34) thus ensure the regularity of the self-organized structure on a large scale.

FIG. 5 represents an array of nanoparticles 8 having the structure that has just been described and is shown in FIG. 4, in which the substrate 2 features a defect 3, in this instance a missing groove 4.

Because the location of the particles 8 of the array is determined not only by the presence of the grooves 4 but also by interaction with the other particles (interaction linked to the self-organization of the particles), the particle 7 situated in line with the defect 3 of the substrate 2 is correctly situated in the array despite the missing groove.

In a similar way, FIG. 6 represents an array of nanoparticles of the type represented in FIG. 4, in which certain particles 9 have a position slightly offset relative to their theoretical position in the array (this is represented diagrammatically in FIG. 6 by a slightly smaller size of the particles 9), which in the absence of the substrate 2 would have produced a phase offset in the array of particles.

However, thanks to the presence of the groove 4, the particle adjacent the particles 9 introducing the offset is situated precisely at the location determined by that groove 4, with no phase offset relative to the particle situated in line with the adjacent groove.

Accordingly, if the interaction between the particles remains high for all the particles of the array, the presence of the grooves (and generally the substrate-particle interaction) enables correction of any small phase offset that might be introduced by a defect in the array of particles considered in isolation.

Moreover, because of the adaptation of the array of grooves 4, 6 to the increment of the array of self-organized particles in the first and second directions, the effect that has just been described is obtained in both directions parallel to the surface of the substrate 2 and this enables the organization of the array of particles in these two directions on a large scale. The tendency to self-organization of the square (or alternatively rectangular) array of particles is therefore strengthened by the presence of the grooves 4, 6 in both directions simultaneously on the surface of the substrate 2.

Figure 8:
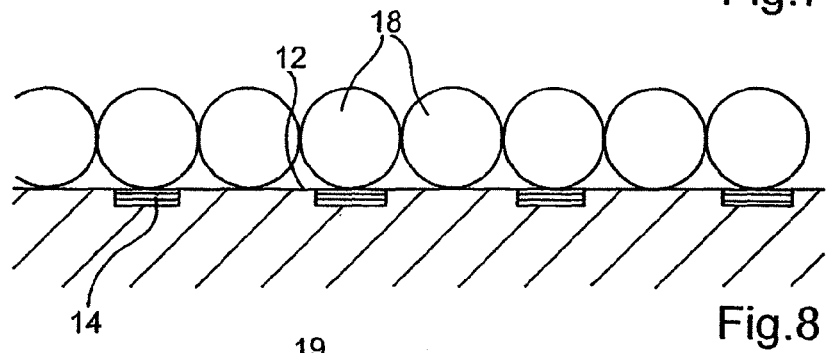
FIG. 8 represents an array of particles disposed on the substrate from FIG. 7.
Figure 9:
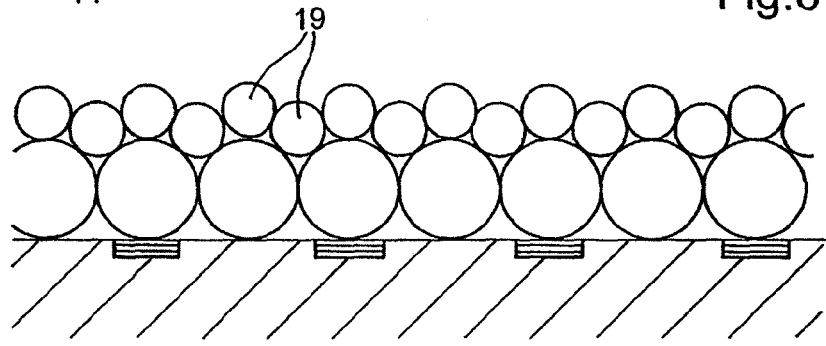
FIG. 9 represents an array composed of particles of two different types on the substrate from FIG. 7.

FIGS. 7 to 9 represent a second embodiment of the invention that will now be described.

In this second embodiment, the raw substrate 12 includes a square array of grooves obtained in an analogous manner to the substrate described in the first embodiment. A material 14 having a particular affinity with the first particles 18 to be organized (as described in detail later) is deposited on this substrate 12 in or between the grooves.

The surface of the substrate intended to receive the particles therefore features a square array of regions formed of this material, for example strips 14; it may be noted that the surface of the substrate obtained in this way may in this case be globally plane, as represented in FIG. 7.

Particles 18 of a first type that have a particular affinity with the material 14 are deposited in the grooves of the raw substrate 12 that has just been described. The increment of the self-organized array of particles matches the increment of the square array of strips of material 14, that is to say that the increment of the square array of strips of material 14 is approximately equal to the increment of the self-organized array of the particles of the first type 18 or an integer multiple of the latter.

Thanks to the affinity of the material 14 and the particles of the first type 18, certain of those particles (one in two in the example represented) are placed at the preferential locations determined by the strips of material 14. The substrate-particle (here material 14-particle 18) interaction is, however, of an amplitude such that it does not call into question the location of the rest of the particles at the locations determined by the self-organization of the array of particles, that is to say by the interactions between particles. Thus the structure represented in FIG. 8 is obtained.

The material 14 may be platinum, for example, having an affinity for particles with an amine function at the surface.

According to one possible embodiment, to obtain an array structure in three dimensions, the array of particles of the first type 18 may be used as a substrate for the deposition and the organization into an array of particles of a second type 19, where applicable according to the invention, as shown diagrammatically in FIG. 9.

Alternatively, the array of particles of the first type 18 could be used as an etching mask (or in another variant as a deposition mask) in order to obtain a second modulation of the substrate with a view to the deposition of another array of particles.

Figure 14:
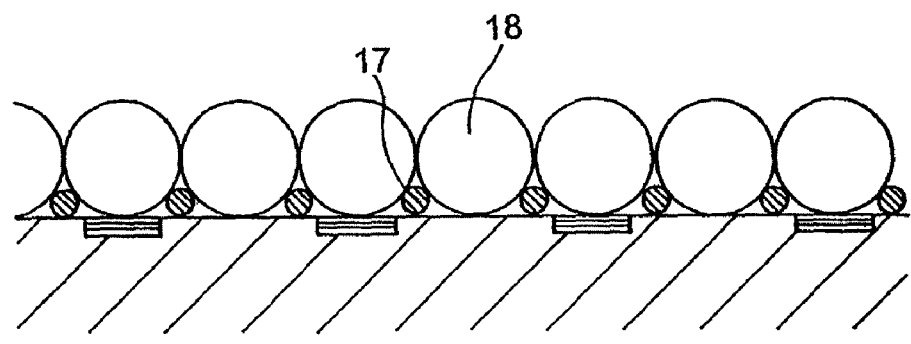
FIG. 14 represents a variant of the array represented in FIG. 9.
Figure 15:
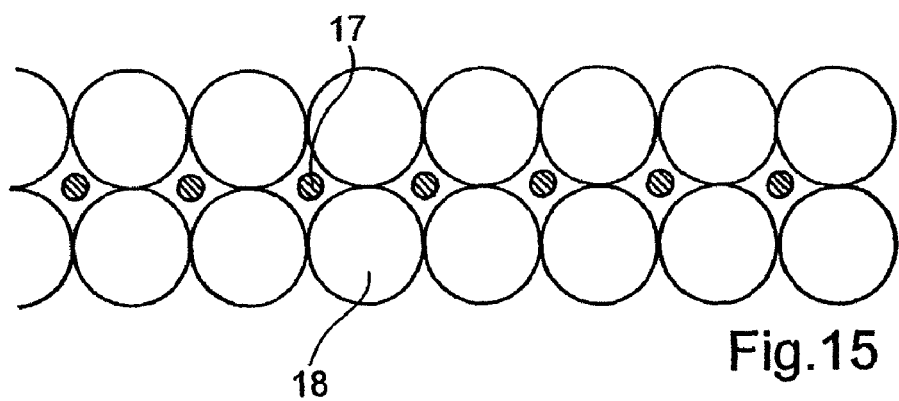
FIG. 15 represents a view from above of the array of particles represented in FIG. 14.

According to another variant shown in FIGS. 14 and 15, the array of particles of the first type 18 locates particles of a second type 17 in an array the increment whereof is fixed by the size of the particles of the first type 18.

Figure 10:
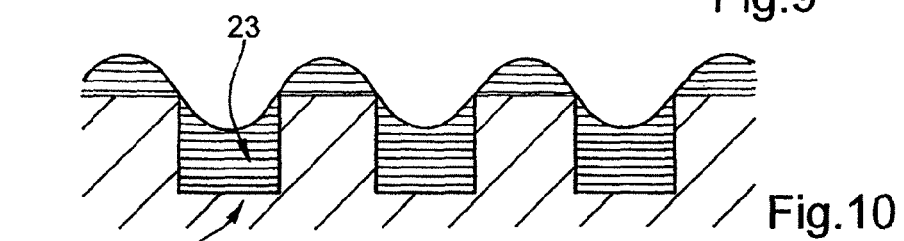
FIG. 10 represents a section of a substrate according to a third embodiment of the invention.
Figure 11:
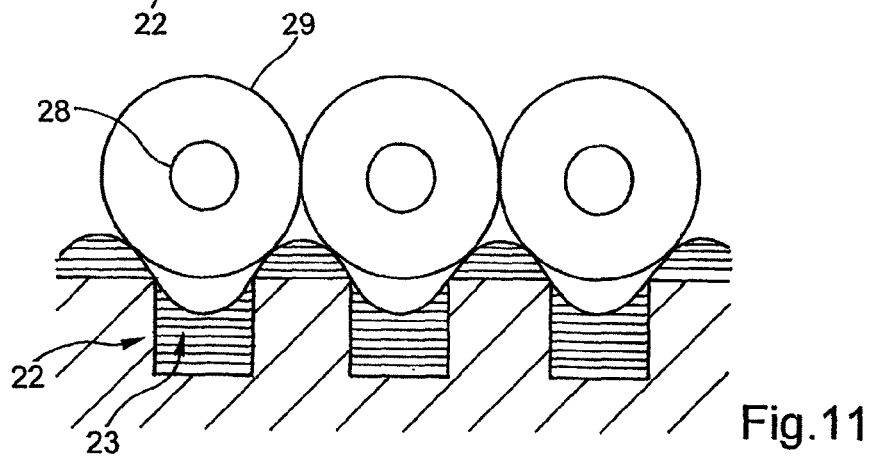
FIG. 11 represents an array of particles disposed on the substrate from FIG. 10.

A third embodiment is represented in FIGS. 10 and 11.

According to this third embodiment, a material 23 is deposited on a substrate 22 featuring a pattern of grooves having a crenellated appearance in section. The deposition of the material 23 is effected here with the aim of reducing the amplitude of the periodic variations of the topography of the substrate.

According to other embodiments in which the substrate-particle interaction is produced by properties other than the topography, reducing the amplitude of the periodic variations of that property in an analogous way could be envisaged; for example, if the property used is an interaction the amplitude whereof decreases with distance (of the electrical or magnetic interaction type), a uniform layer could be deposited to move each of the particles slightly away from the substrate.

The amplitude of the modulation of the property of the substrate used for interacting with the particles can thus be adapted so that this interaction enables preferential location of the particles without making the effect of the interactions between particles negligible.

As in the preceding examples, the period of the patterns (that is to say of the topography of the raw substrate), which is not modified by the deposition of material 23, is adapted to the increment of the array of particles that it must receive.

In the example given here, the particles consist of a core 28 coated with a shell 29. For example, the core 28 is the active element for which the array structure is to be obtained, whereas the shell 29 is intended to facilitate the formation of the array, for example by generating a specific particle-particle interaction or a specific substrate-particle interaction (i.e. an adaptation of the size of the array of particles to the patterns of the substrate 22, 23, as represented diagrammatically in FIG. 11), or the generation of a certain elasticity in the array of particles authorizing a slight mismatch between the period of the pattern of the substrate and the period of self-organization of the array of particles.

According to another possible embodiment (not represented), the substrate-particle interaction may be an interaction at a distance. In this context, there may be provision for producing a buried array of a conductor material, for example in accordance with the solution already referred to for this, which it is possible to charge electrically in order to obtain a certain polarization. A modulated electrical field can be obtained at the surface in this way that acts on the particles to be organized. The polarization of the array may be eliminated once the organization has been effected, if that is appropriate.

The embodiments that have just been described are merely examples of possible implementations of the invention. The various features of those embodiments and those given as variants may in particular be combined differently from the examples given hereinabove.

The invention claimed is:

1. A particle array comprising:
   particles disposed on a substrate, the substrate having a first property enabling an interaction of the substrate and the particles,
   wherein the first property is modulated periodically in a first direction and permitting substantial interaction between each of the particles and neighboring particles in the first direction,
   wherein the particles are self-organized locally with a particular increment in the first direction and
   wherein the first property is modulated in the first direction with a period essentially equal to a multiple of the particular increment, such that the particles remain organized in the particular increment.

2. The particle array according to claim 1, wherein a second property enabling an interaction of the substrate and the particles is modulated in a second direction enabling substantial interaction between each of the particles and neighboring particles in the second direction.

3. The particle array according to claim 1, wherein at least certain particles comprise a central core covered by a shell.

4. The particle array according to claim 3, wherein the shell is adapted to be deformed to enable adaptation of the period of the array.

5. The particle array according to claim 3, wherein the shell participates in one or both of the substrate-particle interaction or the particle-particle interaction.

6. The particle array according to claim 1, wherein the first property is linked to the topography of the substrate.

7. The particle array according to claim 1, wherein the interaction of the substrate and the particles comprises an interaction at a distance.

8. The particle array according to claim 7, wherein the interaction at a distance comprises a magnetic or electrical type interaction.

9. The particle array according to claim 1, wherein the array extends in a direction essentially perpendicular to the surface of the substrate.

10. A method of producing an array of particles comprising depositing particles that are self-organized with a particular increment in a first direction on a substrate, the substrate having a first property permitting interaction of the substrate and the particles and modulated in the first direction with a period essentially equal to a multiple of the particular increment, such that the particles remain organized in the particular increment.

11. The method of producing an array of particles according to claim 10, wherein the particles are further able to self-organize in an array with a second increment in a second direction and the substrate has a second property enabling interaction of the substrate and the particles modulated in the second direction with a period adapted to the second increment.

12. The method of producing an array of particles according to claim 10 further comprising forming patterns on the substrate.

13. The method of producing an array of particles according to claim 12, wherein forming patterns comprises a step of revealing an array of dislocations.

14. The method of producing an array of particles according to claim 12, wherein the forming patterns comprises a lithography process.

15. The method of producing an array of particles according to claim 12, wherein forming patterns comprises a nanoimprinting process.

16. The method of producing an array of particles according to claim 10, further comprising depositing a material that enables the production of the first property.

17. The method of producing an array of particles according to claim 10, further comprising depositing a material that determines an amplitude of modulations of the first property.

18. The method of producing an array of particles according to claim 10, wherein at least a portion of the particles comprise a central core covered by a shell.

19. The method of producing an array of particles according to claim 18, wherein the shell can be deformed to enable the adaptation of the period of the array.

20. The method of producing an array of particles according to claim 18, wherein the shell participates in one or both of the substrate-particle interaction or the particle-particle interaction.

21. The method of producing an array of particles according to claim 10, wherein the property corresponds to the topography of the substrate.

22. The method of producing an array of particles according to claim 10, wherein the interaction of the substrate and the particles comprises an interaction at a distance.

23. The method of producing an array of particles according to claim 22, wherein the interaction at a distance comprises a magnetic or electrical type interaction.

* * * * *

UNITED STATES PATENT AND TRADEMARK OFFICE
CERTIFICATE OF CORRECTION

PATENT NO. : 7,985,469 B2  
APPLICATION NO. : 11/718859  
DATED : July 26, 2011  
INVENTOR(S) : Yves Samson et al.

Page 1 of 1

It is certified that error appears in the above-identified patent and that said Letters Patent is hereby corrected as shown below:

On the Title Page

Item (54), replace "PARTICLE NETWORK COMPRISING PARTICLES DISPOSED ON A SUBSTRATE AND METHOD FOR REALIZING SUCH A NETWORK" with --PARTICLE NETWORK AND METHOD FOR REALIZING SUCH A NETWORK--.

In column 1, in the title, replace "PARTICLE NETWORK COMPRISING PARTICLES DISPOSED ON A SUBSTRATE AND METHOD FOR REALIZING SUCH A NETWORK" with --PARTICLE NETWORK AND METHOD FOR REALIZING SUCH A NETWORK--.

Signed and Sealed this  
Eighteenth Day of October, 2011

David J. Kappos  
*Director of the United States Patent and Trademark Office*